United States Patent [19]
Lamola et al.

[11] Patent Number: 5,212,046
[45] Date of Patent: May 18, 1993

[54] NEAR UV PHOTORESIST

[75] Inventors: Angelo A. Lamola, Sudbury; Gary Calabrese, North Andover; Roger Sinta, Woburn, all of Mass.

[73] Assignee: Shipley Company Inc., Newton, Mass.

[21] Appl. No.: 725,872

[22] Filed: Jun. 28, 1991

Related U.S. Application Data

[63] Continuation of Ser. No. 422,621, Oct. 17, 1989, abandoned.

[51] Int. Cl.$^5$ .............................................. G03C 7/038
[52] U.S. Cl. ..................................... 430/270; 430/926; 430/920; 430/922; 430/925; 522/50; 522/26; 522/25; 522/14; 522/16; 522/126; 522/146
[58] Field of Search ............... 430/926, 920, 922, 280, 430/287, 270, 925; 522/50, 26, 25, 14, 16, 126, 146

[56] References Cited

U.S. PATENT DOCUMENTS

| | | | |
|---|---|---|---|
| 3,169,868 | 2/1965 | Borden | 522/50 X |
| 3,595,664 | 7/1971 | Rust | 96/35.1 |
| 4,069,054 | 1/1978 | Smith | 522/25 X |
| 4,442,197 | 4/1984 | Crivello et al. | 430/280 |
| 4,659,649 | 4/1987 | Dickinson et al. | 430/280 |

FOREIGN PATENT DOCUMENTS

| | | |
|---|---|---|
| 0164248 | 12/1985 | European Pat. Off. |
| A1579538 | 3/1968 | France |
| 1579538 | 8/1969 | France |

OTHER PUBLICATIONS

Burrows, Hugh D. et al., Excited States of Biological Molecules, Wiley, ©1974, pp. 116–127.
Müller, Paulette et al., J. Org. Chem., vol. 24, No. 37, 1959, pp. 37–39.

*Primary Examiner*—Cynthia Hamilton
*Attorney, Agent, or Firm*—Robert L. Goldberg; Peter F. Corless

[57] ABSTRACT

A photoacid-generating photoresist composition sensitized with an aromatic, multi-ring, heterocylcic nitrogen containing sensitizer, preferably a ring extended phenothiazine derivative. The use of the sensitizer permits exposure of photoresists to near UV irradiation where such photoresists have heretofore been exposed to deep UV irradiation. The invention is especially useful for acid hardening photoresist systems.

22 Claims, 2 Drawing Sheets

NEAR UV PHOTORESIST

This is a continuation of copending application Ser. No. 07/422,621 filed on Oct. 17, 1989, now abandoned.

INTRODUCTION

This invention relates to a photoacid-generating photoresist composition that is spectrally responsive to near UV region exposure. More particularly, in a preferred embodiment of the invention, this invention relates to a photocurable photoresist that contains a sensitizer that sensitizes a photoinitiator to near UV exposure.

DESCRIPTION OF THE PRIOR ART

Photoresists are photosensitive films used for transfer of an image to a substrate. They may be negative or positive acting. After a coating of a photoresist is formed on a substrate, the coating is selectively exposed through a photomask to a source of activating radiation. The photomask has areas that are opaque to activating radiation and other areas that are transparent to activating radiation. The pattern in the photomask of opaque and transparent areas define a desired image to be transferred to a substrate. Following exposure of the photoresist film to activating radiation, the photoresist is developed to provide a relief image that permits subsequent processing of the substrate over which the photoresist is coated.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images. Proper exposure of a photoresist requires exposure of the photoresist to a light source of a wavelength to which the photoresist is optically absorptive and which also causes a desired photochemical reaction to occur.

The sensitivity of a photoresist to light is dependent upon several factors including optical absorbance. The optical absorbance of a photoresist may be quantified or illustrated by a spectral response curve for any given photoresist. This is a measure of the response or optical absorbance of a resist to the light spectrum for exposure, usually a mercury-vapor source. The spectral response curve gives a general indication of how effective any given light source will be in exposing a photoresist, but good absorptivity alone at a given wavelength is not an assurance of good sensitivity. Good sensitivity of the basic photoprocess necessary to activate a resist is also required. In order for good sensitivity to occur, the resist must have some finite optical absorbance at the exposing wavelength.

Exposure sources for exposing photoresists can be sources such as lasers or x-rays, but extended mercury xenon lamps comprise the light source predominantly used in current production. Extended mercury lamps emit in three spectral regions, the deep UV region (100 to about 300 nm), the mid UV region (300 to 360 nm) and the near UV region (360 to 450 nm). Because of the unavailability of transparent glasses of various refractive indexes, it is difficult to fabricate lenses for the deep and even mid UV regions. Within the near UV region, the mercury lamp emits strongly or has peaks at 365 nm (known as I-line exposure), 405 nm (known as H-line exposure) and 436 nm (known as G-line exposure). The lamp output is weakest in the deep UV region, and consequently, most semiconductor production facilities use photoresists that optically absorb primarily in the near UV region, especially at that wavelength referred to as G-line.

Phototools used for exposing photoresists, including mercury lamps, and the required spectral response and absorbance of photoresists are all matters known to the art. A discussion of the same can be found in Elliott, *Integrated Circuit Fabrication Technology*, McGraw-Hill Book Company, New York, 1982, pp. 172–175; and Moreau, *Semiconductor Lithography, Principles, Practices, and Materials*, Plenum Press, New York, 1988, pp. 355–378; both incorporated herein by reference.

To fabricate semiconductors having conductor patterns of micron or submicron dimensions, the photoresist not only should exhibit optical absorption and photosensitivity at or near a wavelength closely coincident with emission peak of the light source, it should also be capable of development to yield high resolution, thermally stable images. Many photoresists capable of yielding such thermally stable images comprise photocurable systems that undergo crosslinking by exposure and subsequent processing as a consequence of crosslinking agents being activated by photoinitiators (hereafter the "photocurable resists"). Of the photocurable resists, those using an acid generated photolysis product or photoinitiator are preferred. Such materials are disclosed and published in European patent application No. 0164248 published Nov. 12, 1985; European patent application No. 0232972 published Oct. 19, 1987; and in U.S. Pat. Nos. 4,101,323 and 4,506,003, all incorporated herein by reference. Another preferred class of materials are those based upon a photoinitiated onium ion such as those disclosed in U.S. Pat. Nos. 4,442,197; 4,603,101 and 4,624,912, also incorporated herein by reference.

Many of the resist systems of the prior art that are photoacid-generating compositions, in the absence of spectral sensitizers, often absorb most strongly in the deep UV region and exhibit only minimal absorbance in the mid or near UV regions. However, most production processes utilize imaging equipment having mercury lamps with emission peaks in the mid and near UV regions. Consequently, many high resolution, photocurable photoresist systems are not suitable for use with most production imaging equipment. For this reason, it is desirable to sensitize such resists to near UV exposure.

SUMMARY OF THE INVENTION

Figure 1:
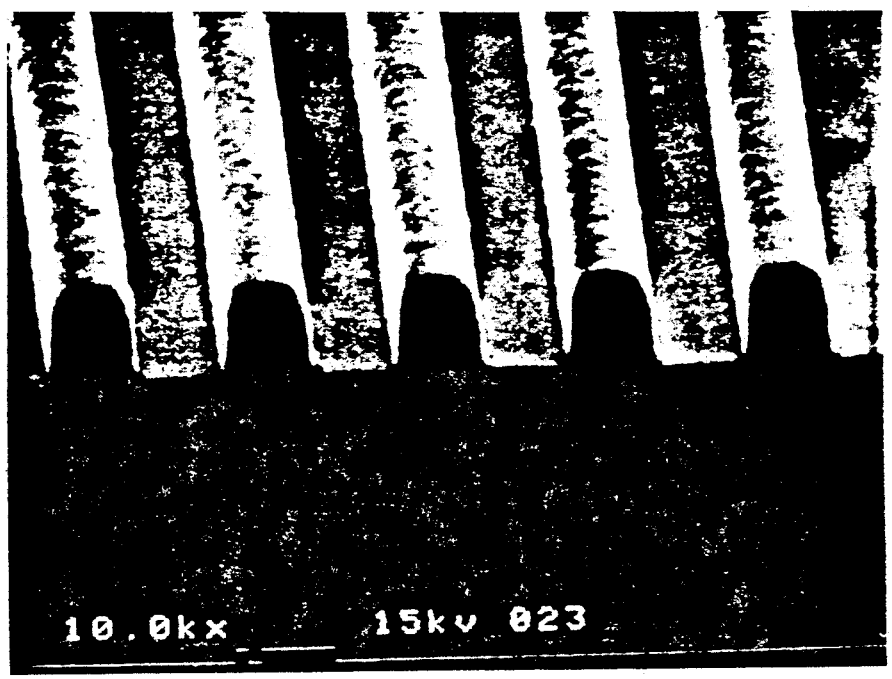
FIG. 1 is a photomicrograph of a resist prepared and processed in accordance with the invention.

The present invention provides photoacid-generating resist compositions that absorb in the near UV region and are especially suitable for G-line exposure. The invention is based upon the discovery that certain aromatic, multi-ring, heterocyclic nitrogen-containing compounds, especially derivatives of phenothiazine, sensitize photocurable resist systems to near UV exposure. By providing photoacid-generating photoresist systems that absorb in the near UV region, such photoresist systems are made suitable for exposure with conventional exposure equipment. Therefore, the commercial utility of such systems is substantially expanded by the subject invention.

Accordingly, there is provided a method using selected sensitizers and photoacid-generating resist systems to produce thermally stable, high resolution submicron images by a process including a step of exposure to near UV radiation. There is also provided new photoacid-generating photoresist compositions that absorb at near UV exposure. Finally, there is provided sensitizers capable of sensitizing photoresist compositions to near UV exposure.

In a preferred embodiment of the invention, there is provided a negative photoresist system comprising an acid hardening resin, a crosslinking agent and a photoacid generator that does not otherwise generate acid upon exposure to near UV radiation, and a sensitizer which promotes photolysis and acid generation when exposed to radiation at wavelengths within the range of from 360 to 450 nm.

DESCRIPTION OF THE PREFERRED EMBODIMENTS

The near UV region, as used herein, is defined to mean radiation having a wavelength within the range of from about 360 nm to about 450 nm. Mercury vapor lamps are a common source of UV radiation and produce near UV radiation having three peak wavelengths at about 365 nm, 406 nm and 436 nm. The peak wavelengths are referred to by the industry as I, H and G-line, respectively. The photoacid-generating resists of the invention are especially suitable for use with G line exposure.

The aromatic, multi-ring, heterocyclic, nitrogen-containing sensitizers of the invention are used with the photoacid-generating resist systems. Acid hardening resist systems are preferred that comprise mixtures of polymers which cure, crosslink or harden upon heating by the catalytic action of acids generated by photolysis.

The preferred acid hardening resin systems for purposes of this invention are those known compositions which, in an uncured state, are soluble in a nonreactive solvent or solvent mixture and are capable of forming a homogeneous, nontacky, adherent film on a substrate surface onto which it is applied. Following application and drying, a film formed therefrom should be free of cracks, crazing and other defects.

As is known in the art, acid hardening resin systems are prepared from a wide variety of aminoplast or phenoplast polymers alone or in combination with compounds or low molecular weight polymers containing a plurality of hydroxyl, carboxyl, amide or imide groups. The acid hardening resist system comprises either a mixture of an aminoplast resin and a reactive hydrogen containing compound or a phenoplast resin. The phenoplast resin can be either a resole resin or a mixture of a novolak and a latent formaldehyde generating compound. The selection of the acid hardening resist system suitable for use in the photoresist may be made by one of ordinary skill in the art and is not considered to be critical to the present invention. Acid hardening resist systems contemplated by the subject invention include, but are not limited to those identified in aforesaid European Patent Publications Nos. 0164248 and 0232972 and U.S. Pat. Nos. 4,101,323; 4,603,101; and 4,624,912.

Aminoplast resins suitable for use in an acid hardening system include urea-formaldehyde, melamine-formaldehyde, benzoguanamine-formaldehyde, glycoluril-formaldehyde resins and combinations thereof. Polymeric aminoplasts may be prepared by the reaction of acrylamide or methacrylamide copolymers with formaldehyde in an alcohol-containing solution, or alternatively by the copolymerization of N-alkoxymethyl acrylamide or methacrylamide with other suitable monomers. Examples of some suitable aminoplasts include the melamine resins manufactured by American Cyanamid Company such as Cymel ® 300, 301, 303, 350, 370, 380, 1116 and 1130; benzoguanamine resins such as Cymel ® 1123 and 1125; glycoluril resins Cymel ® 1170, 1171, 1172; and urea-based resins Beetle ® 60, 65 and 80. A large number of similar aminoplasts are presently commercially available from various suppliers.

As indicated above, the aminoplasts are used in combination with reactive hydrogen-containing compounds in the acid hardening resin system. These reactive hydrogen containing compounds include, for example, novolak resins; polyvinylphenols and copolymers of the same with styrene, alpha-methylstyrene; acrylic resins; polyglutarimides; polyacrylic acid or polymethacrylic acid copolymers; alkali-soluble polyacrylamides and polymethacrylamide copolymers; copolymers containing 2-hydroxyethylmethacrylate and 2-hydroxypropylmethacrylate; polyvinyl alcohols such as those prepared from partially hydrolyzed polyvinyl acetates; alkali-soluble styrene-allyl alcohol copolymers; and mixtures thereof.

Of the above, polyvinyl phenol and its copolymers and novolak resins containing hydroxyl groups and sites for the electrophilic substitution of aromatic rings at positions ortho- or para- relative to the hydroxyl group are preferred. Novolak resins that are useful in conjunction with aminoplasts in the acid hardening resin system are alkali-soluble film forming phenolic resins having a molecular weight (weight average) ranging from about 300 to about 100,000 and preferably from about 1000 to 20,000. These novolak resins may be prepared by the condensation reaction of a phenol, a naphthol or a substituted phenol, such as; cresol, xylenol, ethylphenol, butylphenol, isopropyl methoxyphenol, chlorophenol, bromophenol, resorcinol, naphthol, chloronaphthol, bromonaphthol or hydroquinone with formaldehyde, acetaldehyde, benzaldehyde, furfural acrolein, or the like. Blends of suitable novolak resins may also be used in order to adjust the dissolution rate of the exposed coating in aqueous base solutions as well as for adjusting the viscosity, hardness and other physical properties of the coating. Suitable novolak resins are disclosed in numerous patents including U.S. Pat. Nos. 3,148,983; 4,404,357; 4,115,128; 4,377,631; 4,423,138; and 4,424,315, the disclosures of which are incorporated by reference herein.

Alkali soluble polyvinylphenols and copolymers of polyvinylphenols having a weight average molecular weight ranging from about 2000 to about 100,000 are also preferred resins used with aminoplasts to form useful acid hardening resist systems. These coatings yield thermally stable images capable of withstanding heating for about 30 minutes at temperatures ranging from about 100° to about 250° C.

Aminoplasts may also be used in conjunction with polyglutarimides, prepared according to U.S. Pat. No. 4,246,374, having a weight average molecular weight ranging from about 1000 to about 100,000 which are soluble in aqueous base and contain at least 40 weight percent of the nitrogen atoms in the NH or ammonia form. When polyglutarimides are used in conjunction with aminoplast resins, the aminoplast is present at a concentration of from about 20 to about 80 percent by weight based on the weight of the polyglutarimide.

An alkali-soluble methacrylic acid-styrene copolymer containing at least 15 weight percent, and preferably 30 weight percent, methacrylic acid and having a weight average molecular weight of about 12,000 can also be used in combination with aminoplasts to form an acid hardening resin system useful in the practice of the invention.

Acid hardening resin systems useful in the photosensitive coatings of the invention can also be prepared from phenoplasts by combining a compound that is a latent source of formaldehyde in an acidic media with a novolak resin.

The acid hardening phenoplast-containing resin system can also be formulated with alkali-soluble polyvinylphenols having weight average molecular weights ranging from about 2000 to about 50,000 and preferably about 2000 to about 20,000, in place of the novolak resins. The useful concentration of the latent formaldehyde generator or phenoplast in the acid hardening resin system has been found to be from about 3 to about 30 percent by weight based on the weight of the novolak or polyvinylphenol resin.

The acid hardening resin systems are typically used in combination with a photoacid generator, preferably of the type disclosed in the above identified European Patent Applications. These photoacid generators include organic compounds having halogen substituents and capable of generating a halogen acid upon exposure to actinic radiation. Such halogenated organic photoacid generators include, for example, 1,1-bis[p-chlorophenyl]-2,2,2-trichloroethane (DDT); 1,1-bis[p-methoxyphenyl]-2,2,2-trichloroethane (methoxychlor ®); 1,2,5,6, 9,10-hexabromocyclododecane; 1,10-dibromodecane; 1,1-bis[p-chlorophenyl]-2,2-dichloroethane; 4,4'-dichloro-2-(trichloromethyl)benzhydrol or 1,1-bis(-chlorophenyl)2-2,2-trichloroethanol (Kelthane ®); hexachlorodimethylsulfone; 2-chloro-6-(trichloromethyl)pyridine; O,O-diethyl-O-(3,5,6,-trichloro-2-pyridyl)phosphorothioate (Dursban ®); 1,2,3,4,5,6-hexachlorocyclohe N(1,1-bis[p-chlorophenyl]-2,2,2-trichloroethylacetamide, tris[2,3-dibromopropyl-]isocyanurate; 2,2-bis[p-chlorophenyl]-1,1-dichloroethylene; and their isomers, analogs, homologs and residual compounds.

Residual compounds are intended to include closely related impurities or other modifications of the above halogenated organic compounds which result during their synthesis and which may be present in minor amounts in commercial products containing a major amount of the above compounds.

Another resist system suitable for use with the sensitizers of the invention comprises the photoacid catalyzed cleavage system whereby exposure results in enhanced solubility in the exposed regions. Such system is disclosed in U.S. Pat. Nos. 4,491,628, 4,506,003 and 4,678,737, each incorporated herein by reference. This system comprises a compound having at least one C-O-C bond which can be split by acid; a compound which forms a strong acid when irradiated and a binder that is an aqueous alkali insoluble resin that becomes soluble upon exposure to activating radiation.

Another photoresist system that crosslinks during exposure and processing to which the sensitizer of the invention can be added utilizes an onium salt as a photoinitiator for photoaddition. Typical photoresist systems using onium salts are described in the aforesaid U.S. Pat. Nos. 4,442,197; 4,603,101; and 4,624,912. Such photoresist systems typically utilize a film-forming epoxy resin binder and an onium salt photoinitiator capable of activation by exposure.

Onium salts, particularly those with weakly nucleophilic anions, have been found to be particularly suitable for such systems. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryldiazonium salts and onium salts of group Va and b, Ia and b and I of the Periodic Table, for example, halonium salts, particularly aromatic iodonium and iodoxonium salts, quaternary ammonium, phosphonium and arsonium salts, aromatic sulfonium salts and sulfoxonium salts or selenonium salts.

Examples of suitable epoxy resins and preferred onium salts can be found in the referenced patents.

In accordance with the invention, photocurable compositions of the type described above are capable of photoreaction in the near UV region, especially by G line exposure, by addition of an aromatic, multi-ring, heterocyclic nitrogen-containing compound especially a phenothiazine derivative to the photocurable composition. Where a phenothiazine derivative is one having an extended ring structure such as by fusion of one or more additional aromatic rings onto the phenothiazine, by aromatic substitution onto the phenothiazine, by dimerization, etc. Excluded from the scope of the invention is phenothiazine or a phenothiazine derivative that does not have an extended ring structure. Many of such compounds are believed to be capable of sensitizing photocurable compositions to beyond the deep UV region, but are incapable of sensitizing the photocurable composition to G-line exposure.

The aromatic multi-ring, heterocyclic nitrogen containing sensitizers conform to the following structural formula:

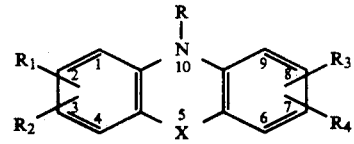

where R is hydrogen, alkyl having from 1 to 8 carbon atoms or aryl; X is sulfur, oxygen, selenium or tellurium; $R_1$, $R_2$, $R_3$ and $R_4$ are independently selected from the group of hydrogen; halogen, such as chlorine, bromine, iodine and fluorine; alkyl, such as methyl, ethyl, propyl, isopropyl, butyl, etc.; and alkoxy, such as methoxy, ethoxy, propoxy, butoxy, etc.; aryl, including substituted aryl, such as benzyl, naphthyl and a phenothiazine radical (to form a dimer) heterocyclic aryl; or $R_1$ and $R_2$ together represent carbon atoms required to complete an aromatic ring, preferably a benzene ring, fused to the carbons of the phenothiazine in the first and second positions on the nucleus, the second and third portions of the nucleus, or the third and fourth positions on the nucleus and $R_3$ and $R_4$ together represent carbon atoms required to complete a benzene ring fused to the carbons of the phenothiazine in the sixth and seventh positions of the nucleus, the seventh and eighth positions of the nucleus or the eighth and ninth positions of the nucleus; provided that at least one of $R_1$, $R_2$, $R_3$, or $R_4$ or $R_1$ and $R_2$ together, or $R_3$ and $R_4$ together is aromatic.

Preferred sensitizers in accordance with the invention are phenothiazine derivatives, and most preferred of such derivatives are the following:

monobenzo-phenothiazines:

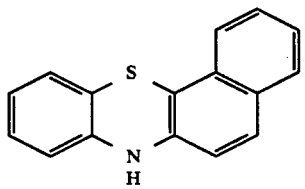

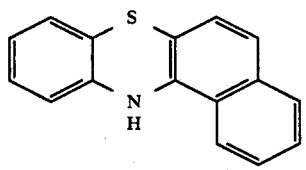

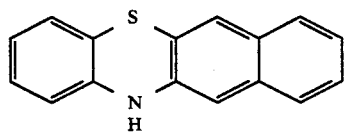

dibenzo-phenothiazines:

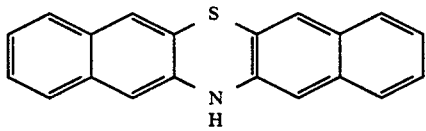

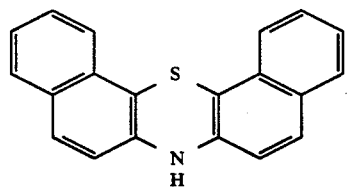

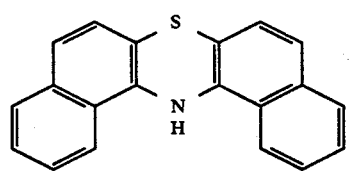

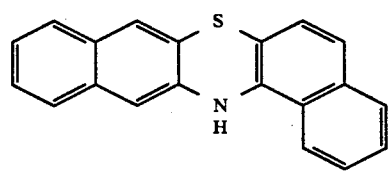

-continued

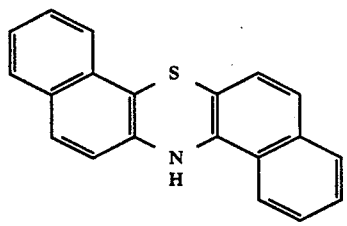

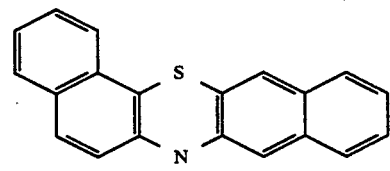

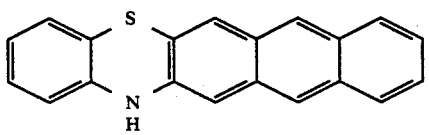

Bis(phenothiazines)

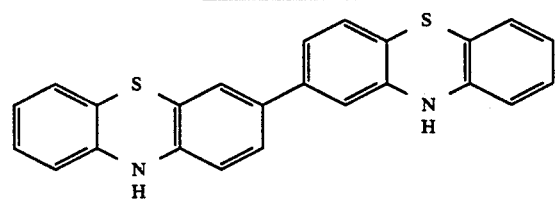

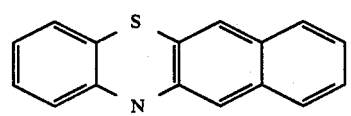

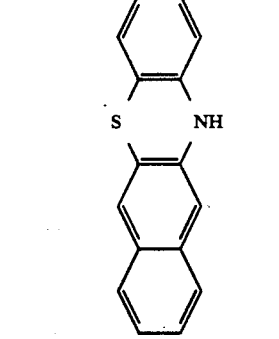

Phenothiazines are well known materials that are readily available in the marketplace. Several examples of phenothiazines, including a derivative of phenothiazine, is disclosed in U.S. Pat. No. 3,169,868, incorporated by reference. Phenothiazine derivatives having extended ring structures are also known in the art. Benzophenothiazines have been the subject of extensive research as they appear to be useful in treatment of certain mental illnesses. Methods for formation of benzophenothiazines and substituted benzophenothiazines are disclosed by Talukdar et al, J. A. Chem. Soc., 80, 3462 (1958). Other derivatives of phenothiazine are described by Van Allan et al, J. Org. Chem. 27, 1659 (1963) and by Tyutyulkov, Simov and Stoyanov, Dolk.

Bolg. Akad. Nauk., 23, 1095 (1970). The aforesaid references are incorporated herein by reference for their disclosure of suitable derivatives of phenothiazine and methods for making the same.

The derivatives of phenothiazine referred to herein as sensitizers are believed to sensitize or activate a photoinitiator, such as a photoacid generator, to exposures at wavelengths in the near UV region, especially at 436 nm or G-line exposure. In the absence of such sensitizers, most photoinitiators would exhibit no useful activity at this exposure. The mechanism by which the sensitizer functions is not fully understood, but it is believed that the sensitizer absorbs within the near UV range and causes the photoinitiator to undergo a chemical transformation leading to the desired curing or crosslinking reaction.

Preferred derivatives of phenothiazine in accordance with this subject invention are the mono- and dibenzophenothiazines and bis(phenothiazine).

A liquid photoresist composition in accordance with the invention comprises the light sensitive system, a resin, other conventional additives and the sensitizer, typically dissolved in a solvent. It is conventional to refer to all of the components dissolved in the solvent as the solids content of the photoresist and to express the concentration of each component as a percentage of total solids. Using this means for expressing concentration, all of the conventional components of the photocurable photoresist composition of the invention are present in their conventional concentration as disclosed in the prior art. The sensitizer is added to the conventional photocurable photoresist in an amount of from about 0.1 to 25 percent by weight of total solids and preferably in an amount of from 0.5 to 12.0 percent, dependent upon the particular photocurable composition to which the sensitizer is added.

As stated above, the solids portion of the photoresist is conventionally dissolved in a solvent. The solvent used does not constitute a part of the invention. However, for purposes of exemplification, for photocurable compositions, useful solvents include glycol ethers, such as ethylene glycol monomethyl ether, ethylene glycol monoethyl ether, ethylene glycol dimethyl ether, methoxy benzene and the like; Cellosolve ® esters such as methyl Cellosolve acetate, ethyl Cellosolve acetate and propylene glycol monomethyl ether acetate; aromatic hydrocarbons such as toluene, xylene and the like; ketones such as acetone, methyl ethyl ketone, cyclopentanone, cyclohexanone; esters such as ethyl acetate, butyl acetate, hexyl acetate, isobutyl isobutyrate and butaryl lactone; amides such as dimethyl acetamide, N-methyl pyrrolidone and dimethyl formamide; chlorinated hydrocarbons such as methylene chloride, ethylene dichloride, 1,1,1-trichloroethane, chlorobenzene and ortho-dichlorobenzene; nitrobenzene; dimethyl sulfoxide; alcohols such as diacetone alcohol; and mixtures of the foregoing.

The total solids content of the liquid coating composition should not exceed about 50 percent by weight of the formulation and preferably, the solids content varies between about 5 and 35 percent by weight of the total composition.

The photoacid-generating photoresists of the invention are used in conventional manner and for conventional purposes. The liquid coating composition is applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The photoresist is applied to substrates conventionally used in processes involving coating with photoresists. For example, the photoresist may be applied over silicon or silicon dioxide wafers for the production of microprocessors and other integrated circuit components. Aluminum—aluminum oxide and silicon nitride wafers can also be coated with the photocurable compositions of the invention. Another suitable use of the photoresist of the invention is as a planarizing layer or for formation of multiple layers in accordance with art recognized procedures.

Following coating of the resist onto a surface, it is dried by heating to remove the solvent until preferably the resist coating is tack free. Thereafter, it is imaged through a mask in conventional manner. Due to sensitization with the phenothiazine derivative in accordance with the invention, the photocurable composition may be exposed to radiation within the near UV range, preferably using a G-line exposure tool. The exposure is sufficient to activate the photoactive component of the photoresist system and typically ranges from about 10 to 300 mJ/cm$^2$, dependent upon the exposure tool.

Following exposure, the photoresist is preferably baked at temperatures ranging from about 160° C. to about 250° C. to cure or crosslink the image in lightexposed areas. Thereafter, the film is developed, preferably with an aqueous based developer such as an inorganic alkali exemplified by sodium hydroxide, potassium hydroxide, sodium carbonate, sodium bicarbonate, sodium silicate, sodium metasilicate, aqueous ammonia or the like. Alternatively, organic developers can be used such as choline based solutions; quaternary ammonium hydroxide solutions such as a tetra alkyl ammonium hydroxide solution; various amine solutions such as ethyl amine, n-propyl amine, diethyl amine, di-n-propyl amine, triethyl amine or, methyldiethyl amine: alcohol amines such as diethanol amine or triethanol amine; cyclic amines such as pyrrole, piperidine etc. In general, development is in accordance with art recognized procedures.

Following development, a final bake at temperatures of from about 100° to about 150° C. for several minutes may be employed if desired.

The following examples are presented to better illustrate the invention, but are not to be construed as limiting the invention to the specific embodiments disclosed.

EXAMPLE 1

This example shows the increased optical absorbency at 436 nm of various phenothiazine derivatives compared to phenothiazine. Measurements were carried out by dissolving the compounds in acetonitrile. Such measurements are known to correlate very well with the optical absorption behavior of these compounds in photoresists.

In Table I below, the molar extinction coefficients of the various components dissolved in acetonitrile is listed at 436 nm. The higher absorptivity observed for the benzo-phenothiazines is an expected consequence of the fact that the low energy UV absorbance maxima of benzo-phenothiazines occur at longer wavelengths than phenothiazine.

TABLE 1

| Compound | Extinction Coefficent at 436 nm, $M^{-1}cm^{-1}$* |
|---|---|
| Phenothiazine | 0 |
| 12H-Benzo[b]phenothiazine | 60 |
| 7H-Benzo[c]phenothiazine | 390 |
| 12H-Benzo[a]phenothiazine | 430 |

*measured in $CH_3CN$. All values are ± 10

EXAMPLE 2

This example represents the most preferred embodiment of the invention and demonstrates the use of a phenothiazine derivative having a non-zero molar extinction coefficient at 436 nm to photosensitize acid generation using a halogen-containing compound at 436 nm. The acid generated by this photosensitized process is used to activate a crosslinking agent to harden and render insoluble to alkali solution a phenolic polymeric binder.

The materials used to prepare the photoresist for this example are set forth below, in parts by weight:

| | |
|---|---|
| Solvent (Diglyme) | 70.936 |
| Poly(p-vinyl phenol)[a] | 24.521 |
| Hexa(methoxymethyl melamine)[b] | 1.839 |
| Photoacid generator[c] | 1.226 |
| 7H-Benzo[c]phenothiazine | 1.478 |

[a]Lyncur PHM-C (Maruzen Oil Co., Tokyo, Japan)
[b]Cymel 303 (American Cyanamid Co.)
[c]Tris(2,3-dibromopropyl) isocyanurate The photoresist was spin coated onto bare silicon wafers (vapor-primed with HMDS for 5 minutes) at 4000 rpm for 30 seconds, then soft baked at 90° C. for 60 seconds on a vacuum hotplate, yielding a film of approximately 1 micron thickness. An array of 5 by 5 mm square regions ("pads") was exposed over a range of exposure energies from 40 to 150 mJ/cm² in steps of 13 mJ/cm², using a GCA 6300 G line (0.38 NA) stepper at a wavelength of 436 nm. A mask was used to form evenly spaced lines. The exposed wafers were then baked ("post-exposure bake") at 145° C. for 60 seconds on a vacuum hotplate to bring about an acid catalyzed crosslinking reaction, and the photoresist was then developed by immersion in Microposit ® MF-312 aqueous alkaline developer at a concentration of 0.18N for 60 seconds at 25° C. with hand agitation. After rinsing and drying, photomicrographs were taken by means of scanning electron microscopy (SEM) at 10,000X magnification. As shown in FIG. 1 of the drawings, the mask pattern of lines (shown as ridges of photoresist) of 0.8 micron width at a spacing of 0.8 micron is fairly well reproduced, with some rounding of the lines at the top. The exposure dose for this particular region was 120 mJ/cm².

EXAMPLE 3

This example demonstrates the use of phenothiazine derivative having a non-zero molar extinction coefficient at 436 nm to photosensitize the decomposition of an onium salt to 436 nm radiation which is used to activate a crosslinking agent to harden and render insoluble to alkali solution a phenolic polymeric binder.

The materials used to prepare the photosensitive composition are set forth below, in parts by weight:

| | |
|---|---|
| Solvent (Diglyme) | 71.0 |
| Poly(p-vinyl phenol)[a] | 24.5 |
| Hexa(methoxymethyl melamine)[b] | 1.8 |
| Onium salt[c] | 1.2 |
| 12H-benzo[a]phenothiazine | 1.5 |

[a]Lyncur PHM-C (Maruzen Oil Co., Tokyo, Japan)
[b]Cymel 303 (American Cyanamid Company)
[c]UVI-6974 (Union Carbide)

The photoresist was spin-coated and soft-baked as in Example 2. Initial film thicknesses of approximately 1 micron were measured with a Nanospec/AFT instrument, basing the calculations on a photoresist refractive index of 1.64. The wafers were then exposed as in Example 2, except that no mask was used and the exposures ranged from 0 to 400 mJ/cm² in steps of approximately 5 mJ/cm². Exposed wafers were baked at 120° C. for 60 seconds on a vacuum hotplate and then developed as in Example 2. After rinsing and drying, the thickness of each pad as well as the unexposed region was measured with the Nanospec/AFT.

Figure 2:
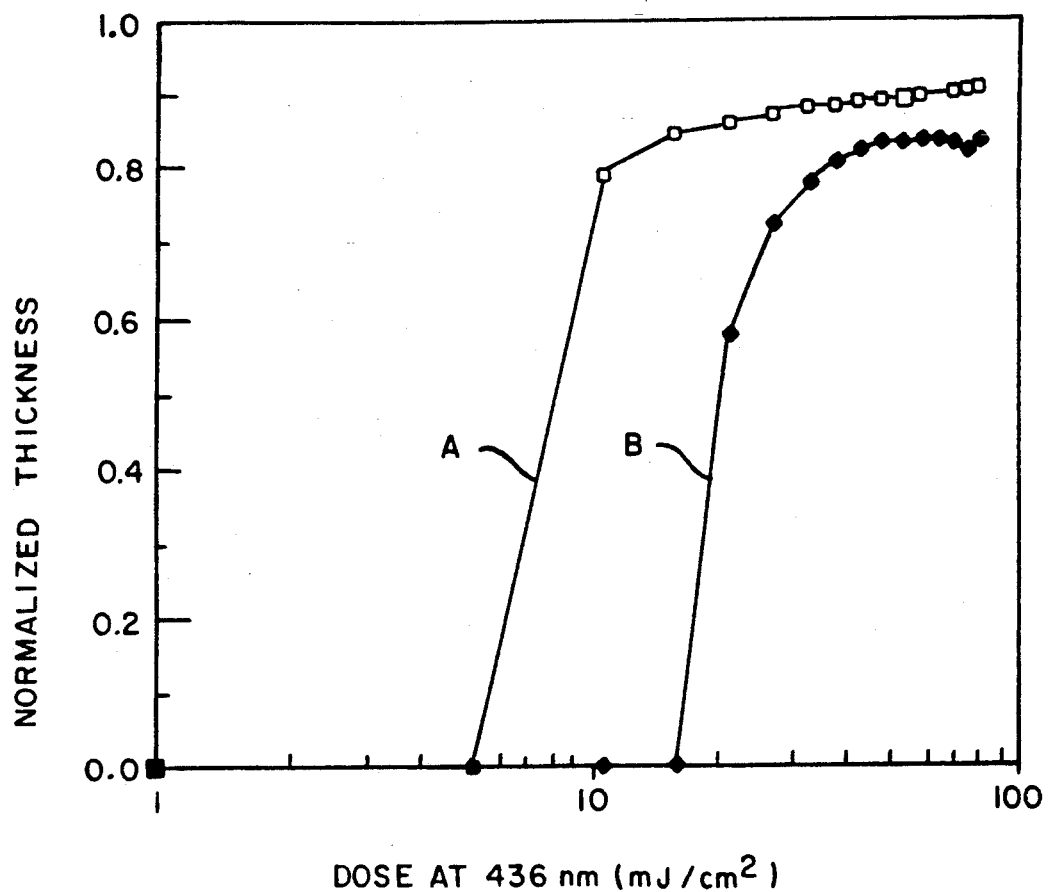
FIG. 2 comprises contrast curves representing the results of Examples 3 and 4 below.

Curve A of FIG. 2 of the drawings shows the contrast curve culled from the data. The "normalized thickness" values represent thickness after development divided by thickness before exposure.

EXAMPLE 4

This example is the same as example 3, except that 12H-Benzo[b]phenothiazine is substituted for 12H-Benzo[a]phenothiazine.

Curve B of FIG. 2 of the drawings shows the contrast curve for this resist formulation which was obtained in the same manner as in Example 3.

We claim:

1. A photoresist composition comprising an acid hardening resin system consisting of a phenolic resin and an aminoplast resin, a halogenated organic, photoacid generating compound that is other than an onium salt and capable of generating a halogen acid upon exposure to actinic radiation, and a sensitizer capable of sensitizing the photoresist to exposure within the range of 360 to 450 nm, said sensitizer having the structural formula:

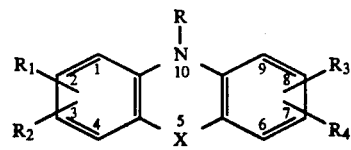

where R is selected from the group of hydrogen, alkyl having one to eight carbon atoms and aryl; X is selected form the group consisting of sulfur, oxygen, selenium and tellurium; $R_1$ and $R_2$ are selected from the group consisting of hydrogen, halogen, lower alkyl, alkoxy, aryl, a phenothiazine radical or $R_1$ and $R_2$ taken together form an aromatic ring fused to the sensitizer nucleus in the first and second positions on the nucleus, the second and third positions on the nucleus, or the third and fourth positions on the nucleus, $R_3$ and $R_4$ are selected from the same group as $R_1$ and $R_2$, or $R_3$ and $R_4$ taken together form an aromatic ring fused to the sensitizer nucleus in the sixth and seventh positions of the nucleus, the seventh and eighth positions of the nucleus, or the eighth and ninth positions of he nucleus; provided that at least one of $R_1$, $R_2$, $R_3$ or $R_4$ is aryl or $R_1$ and $R_2$ taken together, or $R_3$ and $R_4$ taken together, are part of an aryl group; said sensitizer being present in a concentration sufficient to absorb sufficient energy whereby, upon exposure to irradiation within a range of from 360 to 450 nm, photoactivation of the photoacid generating compound occurs.

2. The composition of claim 1 wherein R is hydrogen and X is sulfur.

3. The composition of claim 2 where the concentration varies from about 0.5 to 5.0 percent.

4. The composition of claim 1 where the concentration of the sensitizer is from 0.1 to 25.0 percent of total solids.

5. The composition of claim 1 where the phenolic resin is a polyvinylphenol.

6. The composition of claim 5 where the polyvinyl phenol is partially hydrogenated.

7. The composition of claim 1 where the sensitizer is a monobenzo substituted phenothiazine.

8. The composition of claim 1 where the sensitizer is a dibenzo substituted phenothiazine.

9. The composition of claim 1 where the sensitizer is a bis(phenothiazine).

10. The composition of claim 1 where the photoacid generating compound is selected from the group consisting of 1,1-bis(p-chlorophenyl)-2,2,2-trichloroethane, 1,1-bis(p-methoxyphenyl)-2,2,2-trichloroethane, 1,2,5,6,9,10-hexabromocyclododecane, 1,10-dibromodecane, 1,1-bis(p-chlorophenyl)-2,2-dichloroethane, 4,4'-dichloro-2-(trichloromethyl)benzhydrol, 1,1-bis(-chlorophenyl)-2,2,2-trichloroethanol, hexachlorodimethylsulfone, 2-chloro-6-(trichloromethyl)-pyridine, O,O-diethyl-O-(3,5,6-trichloro-2-pyridyl)-phosphorothioate, 1,2,3,4,5,6-hexachlorocyclohexane, N-1,1-bis(p-chlorophenyl)-2,2,2-trichloroethylacetamide, tris(2,3-dibromopropyl) isocyanurate, and 2,2-bis(p-chlorophenyl)-1,1-dichloroethylene.

11. The composition of claim 1 where the photoacid generating compound is tris(2,3-dibromopropyl) isocyanurate.

12. A method for sensitizing a photoresist to irradiation within a range of from 360 to 450 nm said photoresist comprising an acid hardening resin system consisting of a phenolic resin and an aminoplast resin, and a halogenated organic, photoacid generating compound that is other than an onium salt and capable of generating a halogen acid upon exposure to actinic radiation, said method comprising addition of a phenothiazine to said photoresist in an amount sufficient to absorb energy whereby, upon exposure to irradiation within a range of from 360 to 450 nm, photoactivation of the photoacid generator occurs, said phenothiazine conforming to the formula:

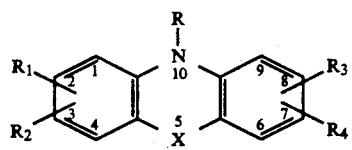

where R is selected from the group consisting of hydrogen, alkyl having one to eight carbon atoms and aryl; X is selected from the group consisting of sulfur, oxygen, selenium and tellurium; $R_1$ and $R_2$ are selected from the group consisting of hydrogen, halogen, lower alkyl, alkoxy, aryl, a phenothiazine radical or $R_1$ and $R_2$ taken together form an aromatic ring fused to the sensitizer nucleus in the first and second positions on the nucleus, the second and third positions on the nucleus, or the third and fourth positions on the nucleus, $R_3$ and $R_4$ are selected from the same group and $R_1$ and $R_2$ or $R_3$ and $R_4$ taken together form an aromatic ring fused to the sensitizer nucleus in the sixth and seventh positions of the nucleus, the seventh and eighth positions of the nucleus, or the eighth and ninth positions of the nucleus; provided that at least one of $R_1$, $R_2$, $R_3$ or $R_4$ is aryl or $R_1$ and $R_2$ taken together, or $R_3$ and $R_4$ taken together are part of an aryl group.

13. The method of claim 12 where the concentration of the sensitizer is from 0.1 to 25.0 percent of total solids.

14. The method of claim 13 wherein the concentration varies from about 0.5 to 5.0 percent.

15. The process of claim 12 where the sensitizer is a monobenzo substituted phenothiazine.

16. The process of claim 12 where the sensitizer is a dibenzo substituted phenothiazine.

17. The process of claim 12 where the sensitizer is a bis(phenothiazine).

18. The method of claim 12 where the photoacid generating compound is selected form the group consisting of 1,1-bis(p-chlorophenyl)-2,2,2-trichloroethane, 1,1-bis(p-methoxyphenol)-2,2,2-trichloroethane, 1,2,5,6,9,10-hexabromocyclododecane, 1,10-dibromodecane, 1,1-bis(p-chlorophenyl)-2,2-dichloroethane, 4,4'-dichloro-2-(trichloromethyl)benzhydrol, 1,1-bis(-chlorophenyl)-2,2,2-trichloroethanol, hexachlorodimethylsulfone, 2-chloro-6-(trichloromethyl)-pyridine, O,O-diethyl-O-(3,5,6-trichloro-2-pyridyl)-phosphorothioate, 1,2,3,4,5,6-hexachlorocyclohexane, N-1,1-bis(p-chlorophenyl)-2,2,2-trichloroethylacetamide, tris(2,3-dibromopropyl)isocyanurate, and 2,2-bis(p-chlorophenyl)-1,1-dichloroethylene.

19. The method of claim 12 where the photoacid generating compound is tris(2,3-dibromopropyl) isocyanurate.

20. A photoresist composition comprising an acid hardening resin system consisting of a phenolic resin and an aminoplast resin, a photoacid generating compound other than an onium salt and a sensitizer capable of sensitizing the photoresist to exposure within the range of 360 to 450 nm, said sensitizer having the structural formula:

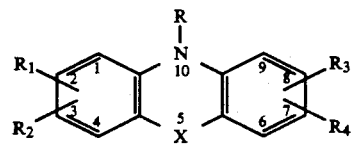

where R is selected form the group of hydrogen, alkyl having one to eight carbon atoms and aryl; X is selected form the group consisting of sulfur, oxygen, selenium and tillurium; $R_1$ and $R_2$ are selected form the group consisting of hydrogen, halogen, lower alkyl, alkoxy, aryl, a phenothiazine radical or $R_1$ and $R_2$ taken together form an aromatic ring fused to the sensitizer nucleus in the first and second positions on the nucleus, the second and third positions on the nucleus, or the third and fourth positions on the nucleus, $R_3$ and $R_4$ are selected from the same group as $R_1$ and $R_2$, or $R_3$ and $R_4$ taken together form an aromatic ring fused to the sensitizer nucleus in the sixth and seventh positions of the nucleus, the seventh and eighth positions of the nucleus, or the eighth and ninth positions of the nucleus; provided that at least one of $R_1$, $R_2$, $R_3$ or $R_4$ is aryl or $R_1$ and $R_2$ taken together, or $R_3$ and $R_4$ taken together, are part of an aryl group; said sensitizer being present in a concentration sufficient to absorb sufficient energy whereby, upon exposure to irradiation within a range of form 360 to 450 nm, photoactivation of the photoacid generating compound occurs.

21. The composition of claim 20 wherein R is hydrogen and X is sulfur.

22. The composition of claim 20 where the concentration of the sensitizer varies from about 0.5 to 5.0 percent by weight to total solids.

* * * * *